(12) United States Patent
Svensson et al.

(10) Patent No.: US 10,674,575 B2
(45) Date of Patent: Jun. 2, 2020

(54) DETERMINATION OF STARTING TIME FOR FLASH EMITTED FROM FLASH TUBE

(71) Applicant: PROFOTO AB, Sundbyberg (SE)

(72) Inventors: Johnny Svensson, Sollentuna (SE); Carl Johan Gurbbström, Saltsjö-boo (SE)

(73) Assignee: PROFOTO AB, Sundbyberg (SE)

( * ) Notice: Subject to any disclaimer, the term of this patent is extended or adjusted under 35 U.S.C. 154(b) by 0 days.

(21) Appl. No.: 16/331,517

(22) PCT Filed: Sep. 5, 2017

(86) PCT No.: PCT/SE2017/050878
§ 371 (c)(1),
(2) Date: Mar. 7, 2019

(87) PCT Pub. No.: WO2018/048340
PCT Pub. Date: Mar. 15, 2018

(65) Prior Publication Data
US 2019/0208611 A1    Jul. 4, 2019

(30) Foreign Application Priority Data

Sep. 9, 2016    (SE) ...................... 1651217

(51) Int. Cl.
*H05B 41/38*    (2006.01)
*H05B 41/30*    (2006.01)
(Continued)

(52) U.S. Cl.
CPC ........... *H05B 41/32* (2013.01); *G01R 19/175* (2013.01); *G01R 33/00* (2013.01); *G03B 15/05* (2013.01);
(Continued)

(58) Field of Classification Search
CPC ...... H05B 41/38; H05B 41/30; G01R 19/175; G01R 33/00; G03B 15/05; G03B 2215/0578

See application file for complete search history.

(56) References Cited

U.S. PATENT DOCUMENTS 5,747,944 A *   5/1998   Harada ................. H05B 41/32
                                                    315/241 P
2002/0048457 A1*  4/2002  Matsui .................. G03B 15/05
                                                    396/157

(Continued)

FOREIGN PATENT DOCUMENTS

FR            2637392 A1      4/1990
JP            2011-160206 A   8/2011
WO    WO 2010/064379 A1       6/2010

OTHER PUBLICATIONS

Samir Patel, EIC2800 Search Report, 2019, Scientific and Technical Information Center (Year: 2019).*

(Continued)

*Primary Examiner* — Raymond R Chai
(74) *Attorney, Agent, or Firm* — Knobbe, Martens, Olson & Bear, LLP

(57) ABSTRACT

The invention discloses a method for determining a starting time for a flash emitted from a flash tube of a flash apparatus. The flash apparatus comprises a triggering circuit, and a drive circuit. The method comprises the steps of measuring an electric current through and/or a voltage across an electrical component of the drive circuit, and determining the starting time for the flash based on the measured electric current and/or voltage.

15 Claims, 5 Drawing Sheets

(51) Int. Cl.
 H05B 41/32 (2006.01)
 G03B 15/05 (2006.01)
 G01R 33/00 (2006.01)
 G01R 19/175 (2006.01)
(52) U.S. Cl.
 CPC ............. *H05B 41/30* (2013.01); *H05B 41/38* (2013.01); *G03B 2215/0578* (2013.01)

(56) References Cited

U.S. PATENT DOCUMENTS

| | | | | |
|---|---|---|---|---|
| 2004/0263090 A1* | 12/2004 | Erlbacher | ............... | H05B 41/30 315/241 P |
| 2005/0231129 A1* | 10/2005 | Chu | ......................... | G03B 7/16 315/241 P |
| 2012/0243859 A1 | 9/2012 | Clark | | |
| 2015/0195445 A1 | 7/2015 | Watanabe | | |
| 2016/0142601 A1* | 5/2016 | Wang | ................... | H04N 5/2256 455/557 |

OTHER PUBLICATIONS

International Search Report and Written Opinion of the International Searching Authority for International Application No. PCT/SE2017/050878, dated Dec. 18, 2017, in 10 pages.
Swedish Search Report for Sweden Patent Application No. 1651217-0, dated Mar. 31, 2017, in 2 pages.
Extended European Search Report for European Patent Application No. 17849200.5, dated Mar. 17, 2020, in 6 pages.
"Xenon Flash Lamps Technical Information Patent Pending", Jan. 1, 2005, XP055189618, Retrieved from the Internet: URL:http://educypedia.karadimov.info/library/Xe-FTLSX9001E05.pdf [retrieved on May 18, 2015].

* cited by examiner

DETERMINATION OF STARTING TIME FOR FLASH EMITTED FROM FLASH TUBE

CROSS-REFERENCE TO RELATED APPLICATIONS

This application is the U.S. National Phase under 35 U.S.C. § 371 of International Application PCT/SE2017/050878, filed Sep. 5, 2017, which claims priority to SE Application No. 1651217-0, filed Sep. 9, 2016, the entire contents of each of which are incorporated by reference herein and made a part of this specification.

TECHNICAL FIELD

The invention relates to a method and a flash apparatus for determining a starting time for a flash emitted from a flash tube.

BACKGROUND ART

Generally, in a flash apparatuses, it is desirable to control the intensity and the colour temperature of the light emitted from the flash tube during a flash as well as the total amount of light emitted from the flash tube.

A flash apparatus typically comprises a generator comprising at least one capacitor configured to apply a voltage to the flash tube. The flash tube comprises a fluid, for example a gas. The fluid in the flash tube is in a normal state an insulator. When a flash is desired, a triggering of the flash tube is performed. There are several methods of triggering the flash tube. For example, a triggering electric current may be supplied to a wire arranged in or around the flash tube. The triggering electric current ionizes parts of the fluid in the flash tube, which causes the fluid to start conducting electric current between the electrodes of the flash tube. The electrical contact between the electrodes of the flash tube allows the at least one capacitor to discharge causing a pulse of electric current to be led through the fluid in the flash tube. This pulse of electric current causes the fluid in the flash tube to emit light. The emitted light has a certain intensity and a certain colour temperature at each point in time during the flash. In addition, a total amount of light is emitted during the flash. The characteristics of the emitted light is dependent on the energy supplied to the flash tube.

The colour temperature of the total amount of light emitted from the flash tube during a flash is an important factor when the flash is used for photographic purposes. In the beginning of the flash, that is, in the beginning of the discharge of the capacitor, normally, light with a higher colour temperature is emitted from the flash tube. At the end of the flash, that is, at the end of the discharge of the capacitor, light with a lower colour temperature is emitted from the flash tube. It is desirable to be able to control the colour temperature of the flash.

In addition, or alternatively, it is desirable to control the intensity of light emitted during a flash and/or the total amount of light emitted from the flash tube during a flash.

One method of controlling the total amount of light and the intensity of the light emitted from a flash tube is to adjust the charging voltage of the capacitors of the generator. The lower the voltage applied to the flash tube, the lower the total amount of light and the intensity of the light emitted during the flash. However, the adjustment of the charging voltage also affects the colour temperature of the emitted light.

One method of controlling the characteristics of the light emitted from the flash tube during a flash is to cut the electrical current supplied to the flash tube at a certain time before the capacitors have discharged completely. By cutting the current to the flash tube at a certain time, the flash tube will stop emitting light and hence, the characteristics of the light emitted from the flash tube may be controlled. With this method, for example a change in colour temperature of the light emitted from a flash tube during a flash caused by a change in charging voltage of the capacitors may be compensated for by cutting the electrical current to the flash tube at a certain point in time.

One way to determine a point in time when the electrical current to the flash tube should be cut in order to achieve the desired characteristics of the light emitted from the flash tube during a flash is to analyse the light emitted by the flash by means of an optical sensor. The data from the optical sensor may then be used in order to determine for example when a certain amount of light has been emitted from the flash. At the moment when a required amount of light has been emitted, the current to the flash tube should be interrupted.

One problem associated with this technique is the requirement of an optical sensor for analysing the light emitted by the flash tube, increasing the cost and the complexity of the flash apparatus.

Another problem is the inaccuracy in optical sensors, introducing a high uncertainty into the determination of the starting point in time for light emission.

Alternatively in the prior art, in order to control the characteristics of the light emitted during a flash, a certain duration of the period of time when light is emitted from the flash tube and hence, a certain duration of the period of time when current is allowed to flow from the capacitor to the flash tube, is required. In order to be able to control the duration of the period of time before the current to the flash tube should be interrupted, a starting time for the flash needs to be determined.

According to prior art, the point in time when a triggering command is sent to a triggering circuit and hence, a triggering current is assumed to start to flow in a triggering circuit, is assumed to be the starting time of the flash and hence is used for determining a point in time when to cut the current to the flash tube. However, there is a variable delay between the point in time when the triggering current is starting to flow until the starting time of the flash due to factors such as temperature, the pressure of the fluid in the flash, triggering energy etc. The duration of the delay is hard to predict due to the many factors involved. Normally this delay is ignored or estimated to be a constant value and the starting time for the flash is assumed to be the starting time for the triggering current, possibly with the addition of an estimated delay. For flashes with a relatively long duration, small errors when determining the starting time of the flash may be acceptable and, therefore, the delay between the triggering of the flash and the actual starting time for the flash may sometimes be neglectable. For flashes with a short duration, however, the accuracy in starting time for the flash determination is crucial and, therefore, the starting time for a flash cannot reliably be determined from triggering current measurements.

Consequently, there is a need and desire for improved control of the characteristics of light emitted during a flash.

SUMMARY

It is an object of the present invention to present a method and a flash apparatus for improved control of the characteristics of the light and/or the total amount of light emitted from a flash tube of a flash apparatus.

It is a particular object of the present invention to present a method and a flash apparatus for solving or at least mitigating one or more of the above mentioned problems associated with controlling the characteristics of the light emitted during the flash and/or the total amount of light emitted from a flash tube of a flash apparatus according to prior art.

According to one aspect of the present disclosure, these objects are achieved by a method for determining a starting time for a flash emitted from a flash tube of a flash apparatus. The flash apparatus comprises a triggering circuit and a drive circuit. The method comprises the steps of measuring an electric current through and/or a voltage across an electrical component of the drive circuit, and determining the starting time for the flash based on the measured electric current and/or voltage.

According to one aspect of the present disclosure, these objects are achieved by a method for determining a starting time for a flash emitted from a flash tube of a flash apparatus. The flash apparatus comprises a triggering circuit, and a drive circuit. The method comprises the steps of measuring a magnetic field around an electrical component of the drive circuit, and determining the starting time for the flash based on the measured magnetic field.

The triggering circuit ionizes some molecules of the fluid in the flash tube in order to make the fluid to start to conduct electric current, and the drive circuit subsequently supplies electric current to the flash tube to cause the flash tube to generate the flash.

When a current starts to flow through the drive circuit, the flash tube starts to emit light and thereby creating a flash. The flow of current through the drive circuit and thereby the flash tube is correlated to the characteristics of the light, such as the intensity of the light emitted from the flash tube and the colour temperature of the light emitted and to the total amount of light emitted during the flash. The relation between the current flow through the flash tube and the characteristics of the light emitted from the flash tube is known, and hence, it is possible to determine a starting time for the flash based on a determined current through the flash tube. The current through the flash tube corresponds to the current flow in the drive circuit. Hence, a measure of the current through a component in the drive circuit and/or voltage across an electrical component of the drive circuit, wherein the component is connected in series with the flash tube in the drive circuit, may be used in order to determine the starting time for a flash.

By determining the starting time for a flash from a measured electric current through and/or a voltage across an electrical component connected in series with the flash tube in the drive circuit, a more accurate starting time for a flash will be achieved compared to the flashes for which the starting time for the flash is based on a triggering command. The uncertainty of the delay from a triggering command until the starting time for a flash is removed by using this method.

In addition, the cost and complexity of the flash tube can be reduced compared to flash tubes utilizing an optical sensor for determining the starting time for a flash based on light characteristic measurements. The thus determined starting time may then be utilized to determine when to cut the current to the flash tube in order to achieve the desired characteristics of the total amount of light emitted from a flash tube during a flash.

A drive circuit of the flash apparatus should herein be interpreted as an electric circuit comprising the power source such as a capacitor, generating the current which is sent through the flash tube causing the fluid in the flash tube to emit light.

It should be noted that the determined starting time for the flash does not necessarily have to correspond to the point in time at which the flash tube starts to emit light. As will be discussed below, the starting time for the flash may, in some embodiments, correspond to a point in time at which the intensity of the light emitted by the flash has reached a predetermined level.

Typically, the electrical component of the drive circuit on which measurements are made is connected in series with the flash tube. Thereby, the measured electric current through and/or voltage across the component corresponds directly to the current through the flash tube and thereby also the characteristics of the light emitted from the flash tube.

According to one exemplary embodiment of the present disclosure, the electrical component on which measurements are made is an inductor, a resistor or a transistor. These electrical components are suitable for measuring an electric current through and/or a voltage across.

According to one exemplary embodiment the method comprises the steps of measuring the voltage across the inductor connected in series with the flash tube in the drive circuit, and determining the starting time for the flash based on the measured voltage.

The voltage across an inductor will change at the time when the current starts to flow through the indictor. In the beginning of the flash, before the fluid in the flash tube has been completely ionized and thereby before the resistance of the fluid in the flash tube has reached a low level, the current through the flash tube is small. However, due to the large amount of energy stored in the capacitor of the drive circuit, the changing rate of the current flow in the drive circuit is high. Due to the laws of electronics, a small change in the current flow in the inductor with a fast changing rate, will give a large change in voltage across the inductor. A large variation of the voltage across the inductor is easier to detect than a small variation of current through the inductor, and hence, by determining a change in voltage across the inductor, an early detection of the current flow through the inductor, even when the current flow is very low through the inductor in the drive circuit, will be achieved.

According to one exemplary embodiment the method comprises the steps of determining an electric current in the drive circuit from the measured current through and/or voltage across a component in the drive circuit, comparing the determined electric current with a reference value, and determining the starting time for the flash based on the comparison.

Since the flow of current through the drive circuit and thereby the flash tube is correlated to the characteristics of the light emitted from the flash tube, such as the intensity of the light emitted from the flash tube during the flash, an accurate starting time for a flash can be received by comparing the determined current through a component in the drive circuit with a reference value. The correlation between current through the drive circuit and thereby through the flash tube, and the characteristic of the light emitted from the flash tube during a flash, may be determined by experimental activities or may be already known for a particular flash tube. The reference value used in a particular situation is chosen in order to correspond to a certain characteristic of the light emitted from the flash tube. The point in time when the determined current in the drive circuit has reached the reference value is considered to be the starting time for a flash emitted from a flash tube of a flash apparatus.

The reference value may be chosen according to the situation. According to one exemplary embodiment, the reference value is set so that at the time when a current is first detected in the drive circuit, that is, as soon as the detected current has reached the reference value which in this exemplary embodiment is 0, the starting time for a flash is determined. However, in the beginning of a flash the intensity of the light emitted is low, and a starting time of the flash may be required to be a time when light of a certain intensity is emitted. Hence, according to one exemplary embodiment, a reference value of the electric current through the drive circuit is set so that the starting time for a flash is a point in time when light of a certain intensity is emitted from the flash tube and hence, the detected current through the induction in the drive circuit has reached a reference value x.

According to one exemplary embodiment the voltage across the inductor of the drive circuit is measured prior to the starting time for the flash.

Due to the laws of electronics, a small change in current flow in an inductor, but with a large changing rate of the current flow in an inductor will cause a large voltage change across an inductor. Hence, by measuring the voltage across an inductor, an early detection of the current flow through the inductor may be received. The relation between the change in voltage across the inductor and the current flow through the inductor is known. Hence by determining the voltage change across the inductor an accurate point in time when current starts to flow through the inductor may be determined. Since the current through a flash tube connected in series with an inductor in the drive circuit corresponds to the current through the inductor, and since the current through a flash tube corresponds to the light emitted from the flash tube, the change in voltage across the inductor may be used in order to determine the starting time for the flash accurately. A starting time for the flash may be determined in the very beginning of the flash. This early determination of a starting time for the flash is advantageous compared to scenarios in which the starting point in time is calculated retrospectively from data obtained after said starting point in time (e.g. from optical measurements of the characteristics of the light emitted during the flash) since this provides more time for the logic of the drive circuit to calculate the point in time at which the supply of current to the flash tube should be cut off to achieve the desired amount of emitted light and/or the colour temperature of the emitted light.

According to one exemplary embodiment the method comprises the step of determining, from said starting time for the flash, a cutting time for cutting the supply of electric current from the drive circuit to the flash tube to interrupt emission of light therefrom at a point in time giving a desired colour temperature and/or a desired total amount of light emitted from the flash tube.

The starting time for the flash is used in order to determine when to cut the electric current flow in the drive circuit in order to achieve a desired total amount of light and also a desired characteristics of the total amount of emitted light. The correlation between current through the inductor in the drive circuit and thereby through the flash tube and the characteristic of the light emitted from the flash tube during a flash, may be determined by experimental activities or may be already known for a particular flash tube and the components of the drive circuit. The current flow through the flash tube from the point in time when the capacitor starts to discharge is known. Hence, if a starting time for the flash is determined, a cutting time may be determined based on the starting time for the flash in order to achieve the desired light characteristics of the flash.

Due to the construction of the drive circuit and its components, the current through the flash tube may continue for a short period of time after the current in the drive circuit is cut, the cutting time, causing light to be emitted from the flash tube after the cutting time. In addition, the high temperature of the flash tube during a period of time after the cutting time, may cause light to be emitted from the flash tube after the cutting time. Hence, the cutting time may occur prior to the point in time when a desired colour temperature and/or desired total amount of light emitted from the flash tube has occurred. When determining the cutting time, several factors such as the energy source in the drive circuit and the type of flash tube etc. affecting the light emitted from the flash tube are taken into consideration in order to achieve the desired characteristics of the light emitted from the flash tube during the flash and the total amount of light emitted from the flash tube during the flash.

According to another aspect of the present disclosure there is provided a flash apparatus comprising a triggering circuit, and a drive circuit. The flash apparatus further comprises a sensor configured to measure an electric current through and/or a voltage across an electrical component of the drive circuit, and a control unit that is configured to determine a starting time for the flash based on the measured electric current and/or voltage.

The triggering circuit is a circuit for ionizing a fluid of a flash tube to make the fluid conduct electric current. The drive circuit subsequentially supplies electric current to the flash tube to cause the flash tube to generate a flash.

Typically the electrical component on which measurements are made is configured to be connected in series with the flash tube during use of the flash apparatus.

According to another aspect of the present disclosure the electrical component is an inductor, a resistor or a transistor.

According to another aspect of the present disclosure the electrical component is an inductor configured to be connected in series with the flash tube during use of the flash apparatus, the sensor being configured to measure a voltage across the inductor and the control unit being configured to determine the starting time for the flash based on the measured voltage.

According to another aspect of the present disclosure the control unit is configured to determine an electric current in the drive circuit from the measured current and/or voltage, compare the determined electric current with a reference value, and determine the starting time for the flash based on the comparison.

According to another aspect of the present disclosure, the control unit is configured to determine, from said starting time for the flash, a cutting time for cutting the supply of electric current from the drive circuit to the flash tube to interrupt emission of light therefrom at a point in time giving a desired colour temperature and/or a desired total amount of light emitted from the flash tube.

According to another aspect of the present disclosure, the drive circuit comprises at least one capacitor for the supply of the electric current that causes the flash tube to generate the flash.

BRIEF DESCRIPTION OF THE DRAWINGS

The present invention will become more fully understood from the detailed description provided hereinafter and the accompanying drawings which are given by way of illustration only. In the different drawings, same reference numerals correspond to the same element.

DETAILED DESCRIPTION

Figure 1:
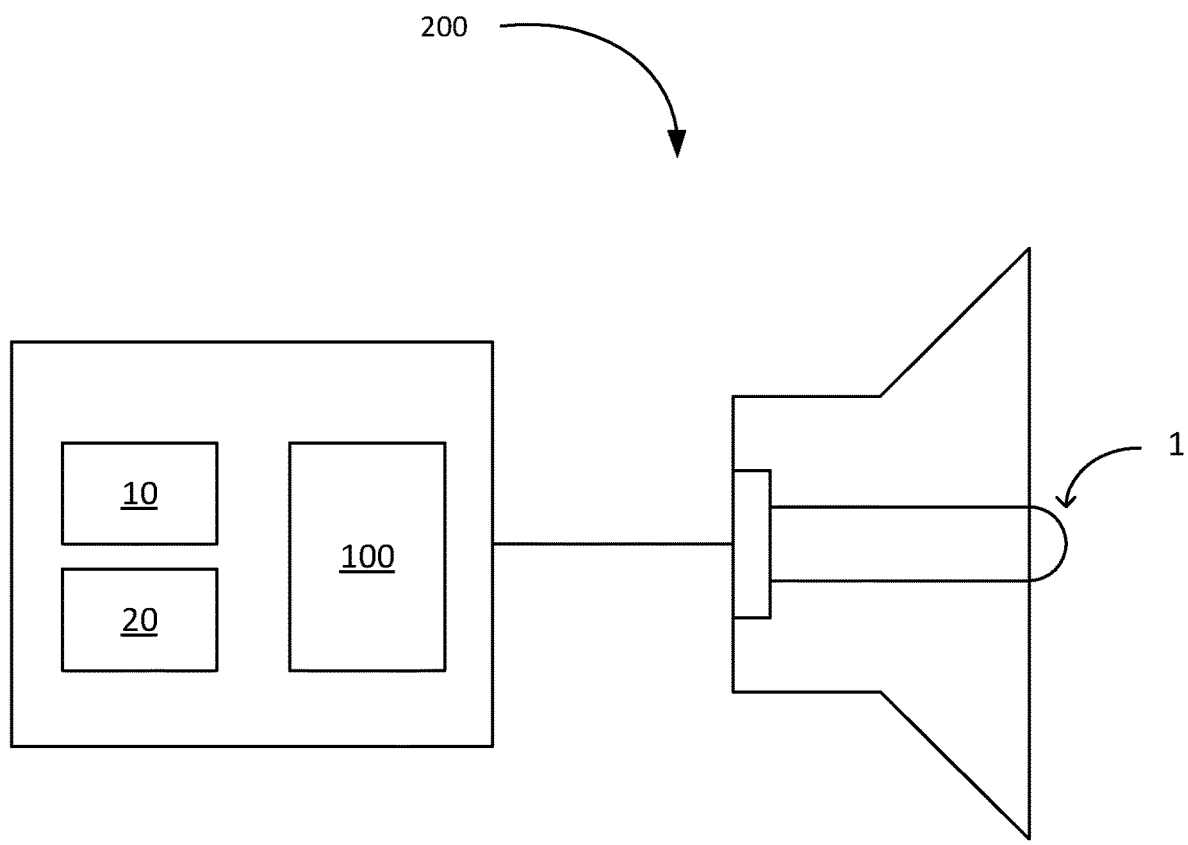
FIG. 1 illustrates a flash apparatus, according to an exemplary embodiment of the present disclosure.

FIG. 1 illustrates a flash apparatus 200 according to an exemplary embodiment of the present disclosure. The illustrated flash apparatus 200 is a flash apparatus for use in the field of photography. The apparatus comprises a triggering circuit 10 and a drive circuit 20 for a flash tube 1 and a control unit 100. The flash apparatus is configured to be connected to a flash tube 1. The drive circuit 20 is an electric circuit comprising the power source, such as a capacitor, generating the current which is sent through the flash tube causing the fluid in the flash tube to emit light. The supply of electric current to the flash tube is controlled by the control unit 100. The flash apparatus 200 may be a stand-alone unit that may or may not be connectable to a camera, or it may form an integral part of a camera. The triggering circuit 10 is an electric circuit typically comprising a power source and a triggering wire around the flash tube. The triggering circuit is arranged to ionize parts of the fluid in the flash tube 1 by sending a triggering current through the triggering wire. The ionization of parts of the fluid in the flash tube enables a subsequent discharge of the capacitor in the drive circuit 20 generating a current sent through the flash tube 1.

Figure 2:
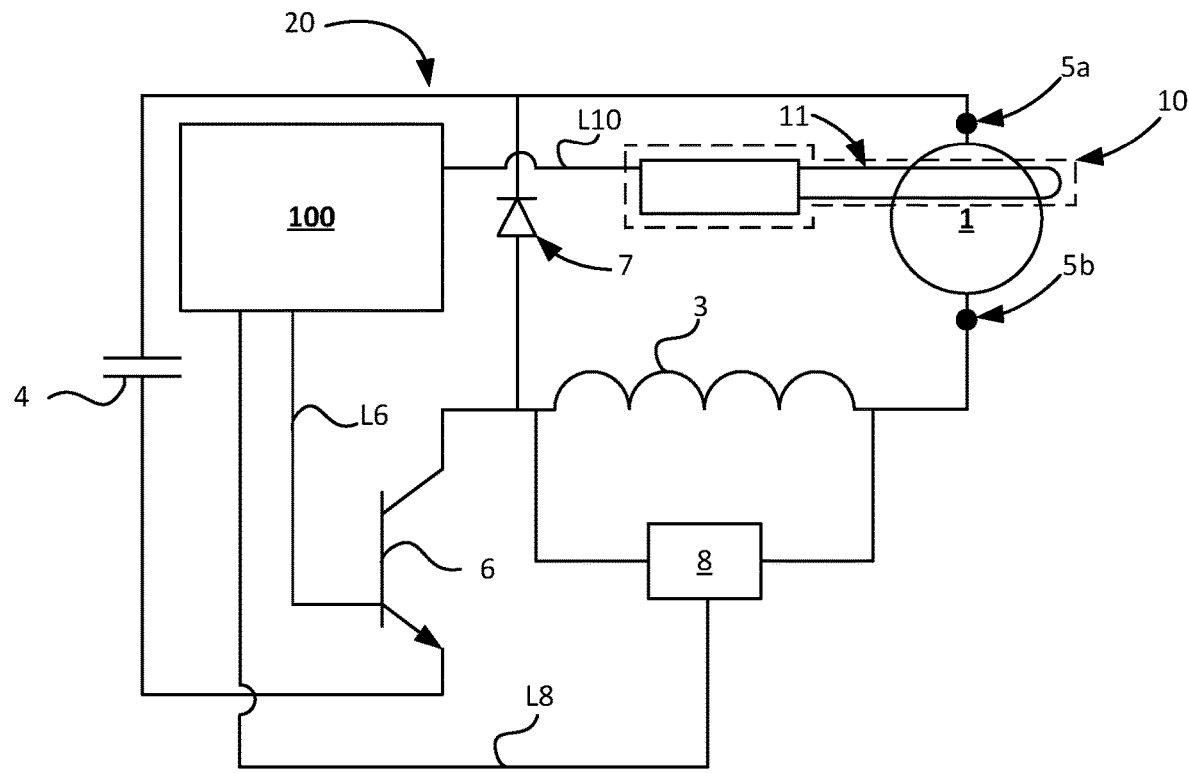
FIG. 2 illustrates a drive circuit forming part of the flash apparatus in FIG. 1.

FIG. 2 illustrates the triggering circuit 10 and the drive circuit 20 of the flash apparatus 200 in FIG. 1. The circuits 10, 20 are coupled to the control unit 100 which, for example, may be constituted by a microprocessor.

The drive circuit 20 comprises a capacitor 4 which is the power source of the drive circuit 20. The capacitor may be of different types, such as a foil type or an electrolytic type of capacitor. According to the embodiment illustrated in FIG. 2, only one capacitor is illustrated. However, according to other embodiments, several capacitors may be connected to the drive circuit in parallel, enabling more energy to be stored and discharged through the flash tube 1.

Further, the drive circuit 20 comprises connection points 5a, 5b, to which a flash tube 1 can be connected. Further, the drive circuit 20 comprises an inductor 3 and a switch 6 connected in series with the capacitor 4 and the flash tube 1. The inductor is arranged to store energy in the drive circuit 20 in cases where the current to the flash tube 1 is controlled, for example by switching the switch 6 on or off and thereby interrupting the current in the drive circuit 20 at intervals. The switch 6 is arranged to be able to switch on or off and thereby control the current in the drive circuit 20. The switch is controlled by the control unit 100 via a link L6. The drive circuit 20 further comprises a component 7, such as a diode, which only allows current in one direction to pass. The component 7 is connected in series with the flash tube 1 and the inductor 3 with one connection point on the conductor between the capacitor 4 and the flash tube 1 and one connection point on the conductor between the inductor 3 and the switch 6. The component 7 has a polarity opposite to a direction of energy supply from the capacitor 4 to the flash tube 1. The component 7 is arranged to enable circulation of the remaining current flow from the inductor 3 when the switch 6 has switched off and thereby interrupted the current flow in switch 6.

The drive circuit 20 illustrated in FIG. 2 comprises only one inductor 3, one switch 6 and one diode 7. However, according to one exemplary embodiment, several sets comprising one inductor, one switch and one diode 7 may be part of the drive circuit 20. Each set is then connected in series with the capacitor and the flash tube 1.

A drive circuit may alternatively be configured in a different way comprising other components such as resistors, transistors etc.

The current through and/or voltage across the inductor 3 may be determined by a sensor 8. The sensor 8 is coupled to the control unit 100 via a link L8.

The sensor 8 may be any type of sensor capable of determining the current through and/or the voltage across an electronic component. The sensor 8 typically comprises a number of electronic components such as resistors, comparators and diodes. The sensor 8 is arranged to be connected to the electronic component in an appropriate way well known in the art.

Corresponding measurements of current through and/or voltage across a component may be performed on other electrical components such as transistors and resistors forming parts of a drive circuit for a flash tube where each component is connected in series with the flash tube and thereby conduct a current indicative of the current flow through the flash tube. Hence, the control unit 100 according to the invention may, in other non-illustrated embodiments, be configured to determine the starting time for a flash based on the measurement of the current through and/or voltage across other electrical components in the drive circuit.

The triggering circuit 10 is arranged to trigger the flash tube 1. The triggering circuit 10 may be any type of triggering circuit known in the art for triggering a flash of a flash apparatus. Typically, the triggering circuit 10 comprises at least some type of power source, such as a capacitor, and a switch controlled by the control unit 100. The triggering circuit 10 also comprises a triggering wire 11 arranged to ionize parts of the fluid in the flash tube 1. The wire 11 may be arranged in the flash tube 1, attached to the flash tube 1 or arranged in close vicinity of the flash tube 1 enabling a triggering current to ionize some of the molecules in the fluid. The triggering circuit 10 is coupled to the control unit 100 via a link L10.

With reference now simultaneously made to FIGS. 3a-3d, when a flash is desired, a triggering command is initiated at the time $t_{trig}$ by the control unit 100. In response to the triggering command, a switch in the triggering circuit 10 is closed, causing a triggering current to flow through the triggering wire 11. The triggering current causes a number of molecules in the fluid in the flash tube 1 to be ionized. At a certain point in time $t_c$, when a certain amount of molecules in the fluid are ionized, the fluid becomes a conductor that serves to establish electrical contact between the connection points 5a and 5b, causing the capacitor 4 to discharge an electric pulse through the flash tube 1. The pulse of current through the flash tube 1 will cause the fluid in the flash tube 1 to emit light, and a flash is created. The time between $t_{trig}$ and $t_c$ when the fluid in the flash tube becomes a conductor, depend on a number of factors, such as the pressure of fluid in the flash tube, the temperature of the components of the flash apparatus and the surroundings, the capacitors, the triggering current etc. The starting time for the flash $t_{s0}$ occurs when light of a certain intensity Y is emitted from the flash tube. According to another exemplary embodiment not illustrated, $t_{s0}$ is chosen to be the point in time when current starts to flow through the flash tube, that is, at $t_c$.

The characteristics of the total amount of light emitted from the flash tube 1 during the flash and/or the total amount of light emitted from the flash tube 1 during a flash 1 may be controlled by cutting the current in the drive circuit 20 at a certain point in time $t_{cut}$. The current in the drive circuit is cut by opening the switch 6, thereby stopping the discharge of energy from the capacitor 4 through the flash tube 1. In order to get accurate characteristics of the light emitted from a flash tube 1, such as a desired colour temperature of the total amount of light and/or a desired total amount of light emitted from the flash tube 1, it is essential to determine an accurate starting time of the flash $t_{s0}$ at which point in time the flash tube 1 emits light of a certain intensity. The starting time of the flash $t_{s0}$ is then used to determine the time $t_{cut}$ at which time the current is cut in the drive circuit 20 in order to achieve the desired characteristics of the flash.

The starting time $t_{s0}$ for a flash, is determined by the control unit 100 by measuring an electric current through and/or a voltage across the electrical component 3 of the drive circuit 20, and based on the measured electric current and/or voltage, determining the starting time $t_{s0}$ for the flash.

Figure 3A:
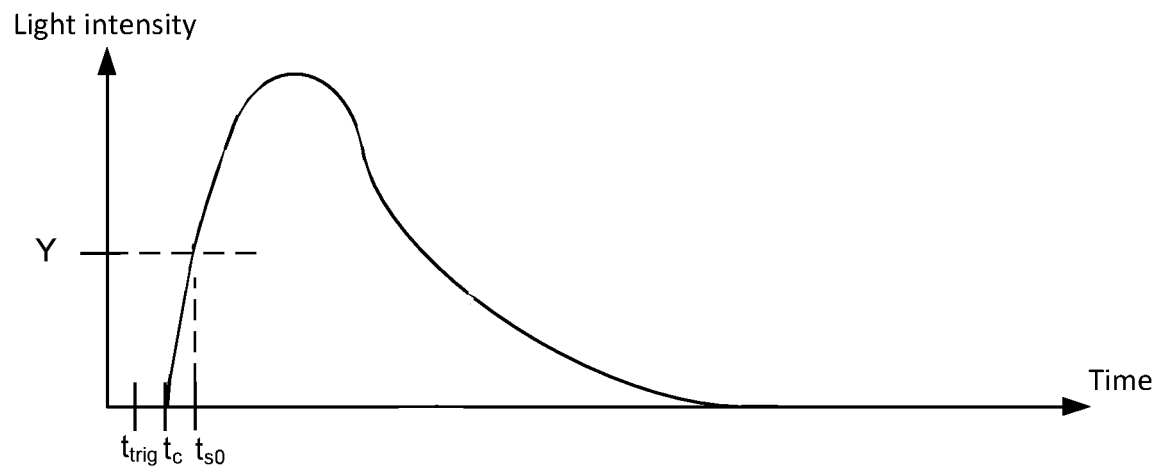
FIG. 3a illustrates emitted light from a flash tube during a flash.

At the time $t_c$, current starts to flow through the inductor 3 and thereby also through the flash tube 1. As can be seen, in the beginning of the flash, when the flash tube starts to conduct current and hence, when the capacitor starts to discharge, a small current flow is led through the flash tube and thereby also through the inductor. However, the changing rate of the current flow is high in the beginning of the flash. Due to the laws of electronics, if the changing rate of a current flow through the inductor 2 is high, even if the current flow through the inductor 3 is low, a large change in voltage across the inductor 3 will occur. Hence, by measuring the voltage across the inductor it will be easier to determine a starting time for the flash than if current flow measurements were made. In FIG. 3a, the intensity of the light emitted from a flash tube during a flash versus time is disclosed. This graph illustrates a flash which is not controlled by cutting the current in the drive circuit 20, hence, the capacitor is fully discharged through the flash tube. The flash is initiated by sending a triggering command to the triggering circuit 10 at the time $t_{trig}$. This command causes a switch in the triggering circuit 10 to close and thereby, a triggering current flows through the triggering wire 11. The current in the wire 11 causes molecules of the fluid in the flash tube 1 to be ionized. After a certain period of time, when enough molecules have been ionized in the fluid in the flash tube 1, the fluid starts to conduct current at a point in time $t_c$. At this point in time, $t_c$, the capacitor 4 in the drive circuit 20 starts to discharge causing a current to flow through the drive circuit 20 and thereby through the flash tube 1 and the inductor 3. The discharge causes a light to be emitted from the flash tube 1. A starting time of the flash $t_{s0}$ is set to correspond to a certain intensity of light being emitted from the flash tube. Accordingly, the starting time of the flash $t_{s0}$ may occur a certain period of time after the flash tube 1 starts to conduct current at $t_c$ at which starting time $t_{s0}$ light of a certain intensity Y is emitted from the flash tube. Alternatively, the starting time $t_{s0}$ is set to be equivalent to $t_c$. In FIG. 3a, the capacitor 4 is allowed to discharge completely through the drive circuit 20. The period of time between the triggering current $t_{trig}$ and $t_c$ depends on a number of factors such as temperature of the fluid in the flash tube 1, pressure of the fluid in the flash tube, temperature of the surrounding air, temperature of the components of the flash tube and the circuit, triggering current etc. Due to the number of factors which interfere with the time between $t_{trig}$ and $t_c$, this period of time is very difficult to predict. By using the method described in this disclosure, this unpredictable period of time does not have to be predicted since the determination of the starting time for a flash is based on measurements made in the drive circuit for the flash tube.

The period of time between when current starts to flow in the drive circuit, at the time, $t_c$ and the starting time for the flash $t_{s0}$ is known since the relation between the flow of current through the flash tube and the intensity of the emitted light from the flash tube is known or derivable.

Figure 3B:
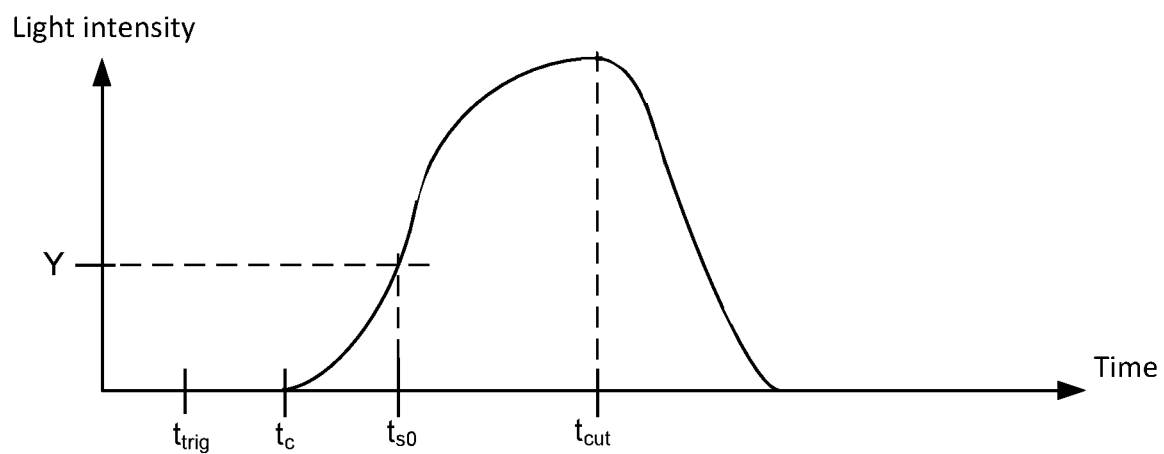
FIG. 3b illustrates emitted light from a flash tube during a flash where the current is cut at a certain point in time.

In FIG. 3b, the intensity of the light emitted from a flash tube 1 during a controlled flash versus time is illustrated. At the time $t_{trig}$ a triggering current is sent through the triggering circuit 10. After a certain time, at $t_{s0}$, light of a certain intensity Y, where the intensity Y has been chosen for a specific occasion, is emitted from the flash tube 1. At the point in time $t_{cut}$, the switch 6 is opened, and hence, the current through the drive circuit 20 and thereby through the flash tube 1 is interrupted. The flash is thereby interrupted. The total amount of light emitted and/or the colour temperature of the total amount of light emitted from the flash tube 1 is controlled by controlling $t_{cut}$. In order to get an accurate control of the flash, it is essential to accurately determine the starting time of the flash, $t_{s0}$ enabling a determination of $t_{cut}$ based on $t_{s0}$. Since the characteristics of light emitted from a specific flash tube connected to a specific drive circuit comprising specific components over time is known, an accurate determination of $t_{cut}$ can be achieved by determining $t_{s0}$ accurately. As can be seen in the figure, light is still emitted from the flash tube 1 after $t_{cut}$. This is due to the inductor 3 which will continue to conduct current a short period of time after the switch 6 has been opened. In addition, due to the high temperature of the flash tube 1 and the fluid therein, the flash tube 1 will emit light a short period of time after current has stopped flowing through the flash tube 1 until the temperature has decreased below a certain value. This extra light emitted after $t_{cut}$ can be determined and hence taken into account when $t_{cut}$ is determined based on $t_{s0}$.

Figure 3C:
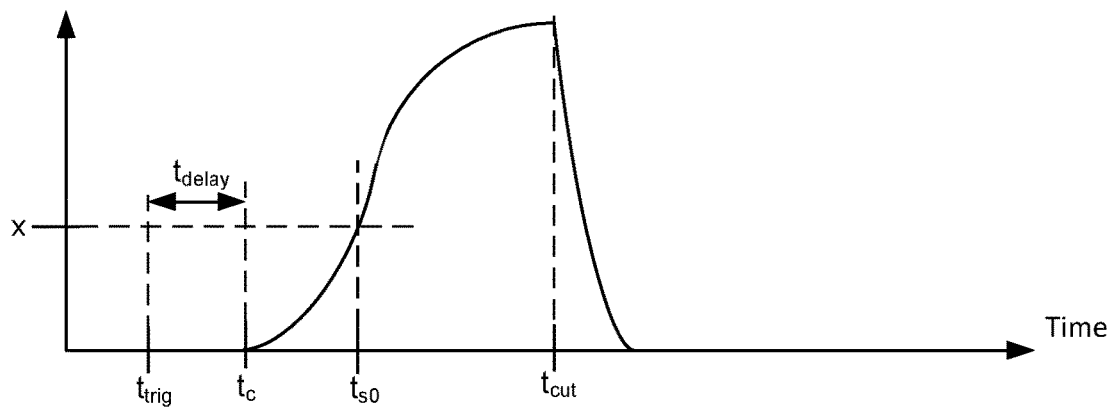
FIG. 3c illustrates the current in a drive circuit for a flash where the current is cut at a certain point in time.

FIG. 3c illustrates the current through the inductor 3 connected in series with the flash tube and the capacitor 4 in a drive circuit 20 for a flash apparatus 200 during a controlled flash. At the time $t_{trig}$ a triggering current is conducted through the triggering circuit 10. After a certain time $t_{delay}$ current starts to flow through the flash tube 1 and thereby through the inductor 3. This current through the flash tube 1 causes light to be emitted. From this point in time $t_c$, the current flow through the flash tube 1 and thereby through the drive circuit 20 and the inductor 3 rapidly increases to a maximum value. The speed of the increase and the maximum value of the current flow through the drive circuit and thereby the inductor depend on the capacitors used in the drive circuit 20, the components of the drive circuit 20, the flash tube 1, the type of fluid in the flash tube, the pressure of the fluid in the flash tube 1 etc. After the maximum value of the current flow through the drive circuit 20 has been reached, the current flow through the drive circuit decreases slowly until the switch 6 in the drive circuit 20 is opened at $t_{cut}$. Due to the inductor 3 and the diode 7 in the drive circuit, the current through the inductor 3 does not stop directly at the time $t_{cut}$ above, but a short period of time after $t_{cut}$. An accurate starting time for a flash $t_{s0}$ can be received by comparing the determined current through the inductor 3 in the drive circuit with a reference value x. The correlation between current through the drive circuit and thereby through the flash tube, and the characteristic of the light emitted from the flash tube during a flash, may be determined by experimental activities or may be already known for a particular flash tube and the components of the flash apparatus. The reference value used in a particular situation is chosen in order to correspond to a certain characteristic of the light emitted from the flash tube. The point in time when the determined current in the drive circuit has reached the reference value x is considered to be the starting time $t_{s0}$ for a flash emitted from a flash tube of a flash apparatus. The reference value x may be chosen according to the situation. According to one exemplary embodiment not illustrated in this exemplary embodiment, the reference value x is set so that at the time when a current is first detected in the drive circuit at $t_c$ is also the starting time for the flash $t_{s0}$.

Figure 3D:
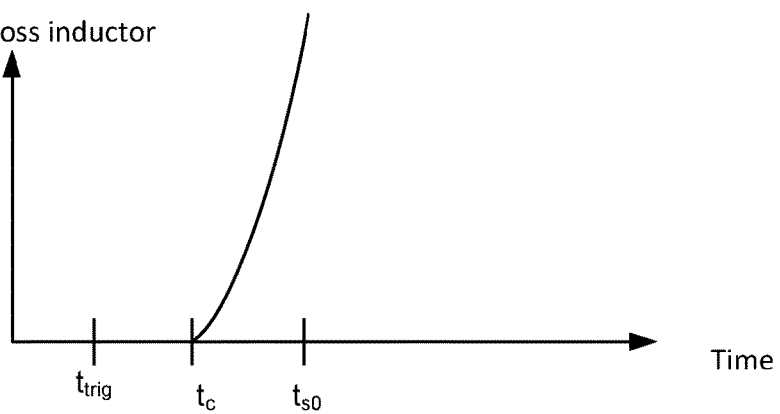
FIG. 3d illustrates the voltage over a component in a drive circuit for a flash.

FIG. 3d illustrates the voltage across the inductor 3 in the drive circuit 20 during the first period of time of a controlled flash. At the time $t_{trig}$ a triggering current is conducted through the triggering circuit 10. At the time $t_c$ when current starts to flow through the inductor, a large change in voltage across the inductor is induced due to the capacitor discharge. This change in voltage across the inductor 3 may be determined by the sensor 8. The time between $t_c$ and the starting time for a flash $t_{s0}$ chosen for a specific situation is also known or derivable.

Figure 4:
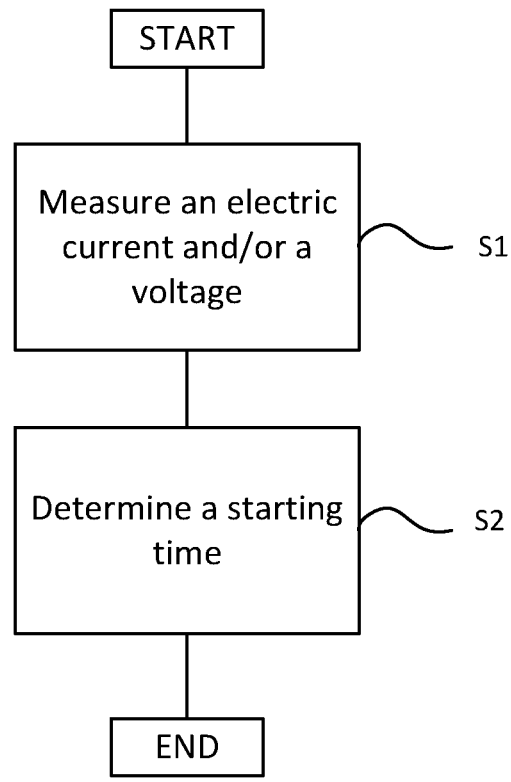
FIG. 4 illustrates a flow chart of the method according to an exemplary embodiment of the present disclosure.

FIG. 4 is a flow chart illustrating a method for determining a starting time $t_{s0}$ for a flash emitted from a flash tube of a flash apparatus comprising a triggering circuit and a drive circuit, according to one embodiment of the present disclosure.

The triggering circuit is arranged to ionize a fluid of the flash tube to make the fluid conduct electric current, and the drive circuit supplies subsequently electric current to the flash tube to cause the flash tube to generate the flash.

In a first step, S1, an electric current through and/or a voltage across an electrical component connected in series with the flash tube in the drive circuit for a flash tube is measured. The current through and/or the voltage across the electrical component of the drive circuit is compared with a reference value, chosen for a specific situation. The measurements are made continuously until the measured value has reached the reference value. The reference value is set at a level which corresponds to the flash tube emitting light of a specific intensity. The component on which measurements are made is typically connected in series with the flash tube and the capacitor in the drive circuit.

Any device capable of measuring the current through and/or a voltage across an electrical component, such as a sensor 8 illustrated in FIG. 2 may be used.

In a second step, S2, a starting time $t_{s0}$ for the flash is determined based on the result of the comparison in step S1.

What is claimed is:

1. A method for determining a starting time ($t_{s0}$) for a flash emitted from a flash tube of a flash apparatus comprising a triggering circuit, and a drive circuit, the method comprising:
   measuring a voltage across an inductor of the drive circuit, and
   determining the starting time ($t_{s0}$) for the flash based on the measured voltage,
   wherein the inductor connected in series with the flash tube.

2. The method according to claim 1, wherein the voltage across the inductor of the drive circuit is measured prior to the starting time ($t_{s0}$) for the flash.

3. The method according to claim 1, further comprising the step of:
   determining, from said starting time ($t_{s0}$) for the flash, a cutting time ($t_{cut}$) for cutting the supply of electric current from the drive circuit to the flash tube to interrupt emission of light therefrom at a point in time giving a desired colour temperature and/or a desired total amount of light emitted from the flash tube.

4. A method for determining a starting time ($t_{s0}$) for a flash emitted from a flash tube of a flash apparatus comprising a triggering circuit, and a drive circuit, the method comprising:
   measuring an electric current through and/or a voltage across an electrical component of the drive circuit,
   determining the starting time ($t_{s0}$) for the flash based on the measured electric current and/or voltage,
   determining an electric current in the drive circuit from the measured current and/or voltage,
   comparing the determined electric current with a reference value, and
   determining the starting time ($t_{s0}$) for the flash based on the comparison.

5. The method according to claim 4, wherein the electrical component is connected in series with the flash tube.

6. The method according to claim 4, wherein the electrical component is an inductor, a resistor or a transistor.

7. The method according to claim 4, further comprising the step of:
   determining, from said starting time ($t_{s0}$) for the flash, a cutting time ($t_{cut}$) for cutting the supply of electric current from the drive circuit to the flash tube to interrupt emission of light therefrom at a point in time giving a desired colour temperature and/or a desired total amount of light emitted from the flash tube.

8. A flash apparatus comprising a triggering circuit, and a drive circuit, the flash apparatus comprising:
   a sensor configured to measure a voltage across an inductor of the drive circuit, and
   a control unit that is configured to determine a starting time ($t_{s0}$) for the flash based on the measured voltage,
   wherein the inductor is configured to be connected in series with a flash tube during use of the flash apparatus.

9. The flash apparatus according to claim 8, wherein the control unit is configured to determine, from said starting time ($t_{s0}$) for the flash, a cutting time ($t_{cut}$) for cutting the supply of electric current from the drive circuit to the flash tube to interrupt emission of light therefrom at a point in time giving a desired colour temperature and/or a desired total amount of light emitted from the flash tube.

10. The flash apparatus according to claim 8, wherein the drive circuit comprises at least one capacitor for the supply of an electric current that causes the flash tube to generate the flash.

11. A flash apparatus comprising a triggering circuit, and a drive circuit, the flash apparatus comprising:
   a sensor configured to measure an electric current through and/or a voltage across an electrical component of the drive circuit, and
   a control unit that is configured to determine a starting time ($t_{s0}$) for the flash based on the measured voltage, wherein the control unit is configured to determine an electric current in the drive circuit from the measured current and/or voltage, compare the determined electric current with a reference value, and determine the starting time ($t_{s0}$) for the flash based on the comparison.

12. The flash apparatus according to claim 11, wherein the electrical component is configured to be connected in series with a flash tube during use of the flash apparatus.

13. The flash apparatus according to claim 11, wherein the electrical component is an inductor, a resistor or a transistor.

14. The flash apparatus according to claim 11, wherein the control unit is configured to determine, from said starting time ($t_{s0}$) for the flash, a cutting time ($t_{cut}$) for cutting the supply of electric current from the drive circuit to a flash tube to interrupt emission of light therefrom at a point in time giving a desired colour temperature and/or a desired total amount of light emitted from the flash tube.

15. The flash apparatus according to claim 11, wherein the drive circuit comprises at least one capacitor for the supply of an electric current that causes a flash tube to generate the flash.

* * * * *

UNITED STATES PATENT AND TRADEMARK OFFICE
CERTIFICATE OF CORRECTION

PATENT NO. : 10,674,575 B2
APPLICATION NO. : 16/331517
DATED : June 2, 2020
INVENTOR(S) : Johnny Svensson It is certified that error appears in the above-identified patent and that said Letters Patent is hereby corrected as shown below:

On the Title Page

Column 1, Item (72), Line 2, under Inventors, delete "Carl Johan Gurbbström," and insert --Carl Johan Grubbström,--.

In the Claims

In Column 12, Line 67, Claim 11, after "measured" insert --electric current and/or--.

Signed and Sealed this
Sixth Day of October, 2020

Andrei Iancu
*Director of the United States Patent and Trademark Office*